United States Patent [19]
Kaneko

[11] Patent Number: 5,820,952
[45] Date of Patent: Oct. 13, 1998

[54] CARRIER TAPE

[75] Inventor: Satoshi Kaneko, Toyoake, Japan

[73] Assignee: Kaneko Denki Kabushiki Kaisha, Nagoya, Japan

[21] Appl. No.: 869,144

[22] Filed: Jun. 4, 1997

[51] Int. Cl.⁶ .................................................. B65D 73/02
[52] U.S. Cl. ........................... 428/34.1; 428/99; 428/136; 206/714
[58] Field of Search ........................... 428/34.1, 99, 136; 206/714, 713, 717

[56] References Cited

U.S. PATENT DOCUMENTS 5,234,104  8/1993  Schulte et al. ........................... 206/714

*Primary Examiner*—Alexander Thomas
*Attorney, Agent, or Firm*—Dennison, Meserole, Pollack & Scheiner

[57] ABSTRACT

The object is to provide a carrier tape which is provided with retainer arms to effectively prevent the contents from falling out of the accommodating recesses and to prevent the accommodating recesses from fitting into each other and which can be inexpensively manufactured.

The carrier tape is provided in a line with a large number of accommodating recesses at predetermined intervals and the retainer arms are formed in separate attachment sheets secured to the top surface of the carrier tape and are substantially horizontally projected at the top level of and to the inside of the accommodating recess.

2 Claims, 8 Drawing Sheets

CARRIER TAPE

BACKGROUND OF THE INVENTION

1. Field of the Invention

This invention relates to an improvement of a carrier tape provided in a line with a large number of accommodating recesses to contain electronic parts or the like.

2. Description of the Prior Art

Electronic parts in general are very fine parts, so that those are contained in a carrier tape provided in a line with accommodating recesses to contain a large number of the electronic parts or the like so as to transport such fine parts by accommodating them individually without damage or so as to be beneficial in utilization in the installing apparatus for assembly of the electronic parts. The inventor has already filed an application for a carrier tape as shown in FIG. 7 and FIG. 8, in which the carrier tape 1 is provided with retainer arms 3 as integral parts thereof projecting to the inside of the accommodating recess S in order to prevent the contained electronic parts from falling out of the recess S. This retainer arm 3 is formed in the process that when the carrier tape 1 is embossed by use of the forming die to form the accommodating recesses S, cutout portions K are cut out by the die and folded back to form the retainer arms as integral parts projecting at the top level of the accommodating recesses S.

Regarding such a retainer arm 3, there was a problem. When the retainer arm 3 is formed as an integral part of the carrier tape, it is naturally required to cut out the cutout portion K, and as a result it contains a fear that the contained electronic part falls out of the cutout portion K. Also, there was another problem in the retainer arm 3. When the electronic part grasped by a chuck or the like (not shown) is lowered to press and displace the retainer arm to be contained in the accommodating recess S, the thickness of the retainer arm is required to be thin so as to ensure the effective elasticity. In this case, it is necessary to form the accommodating recesses in the carrier tape made of thin sheet. That is, when the accommodating recess is formed by deep drawing, the walls and the like of the recess are stretched to be too thin because of the thin sheet.

Furthermore, in the shape of the carrier tape 1 as shown in FIG. 7 and FIG. 8, there was a problem. That is, the forming die becomes complicated because of forming the cutout portion K and the like and consequently the cost of the die comes expensive. Moreover, when the carrier tape 1 is wound on the reel or the like, some bottoms of the upper accommodating recesses S engage with the lower accommodating recesses S through the cutouts K. Such an engagement resulted in a problem that the carrier tape 1 was damaged when it was pulled out of the reel.

SUMMARY OF THE INVENTION

The present invention is originated in order to solve the above-mentioned problems in the prior art, and an object of the invention is to provide a carrier tape which can effectively prevent the contained electronic part or the like from falling out of the accommodating recess and can be used in the condition turned upside down.

Another object of the invention is to provide a carrier tape of which the retainer arm can be freely determined in the thickness to change the strength of itself without regard to the thickness of the accommodating recess.

A further object of the invention is to provide a carrier tape of which the accommodating recess can be formed by a simple forming die and formed in a deep depth.

A still further object of the invention is to provide a carrier tape of which the total cost can be decreased because of the simplified forming die.

Still another object of the invention is to provide a carrier tape which can effectively prevent the bottom of the upper accommodating recess from fitting in the lower accommodating recess to solve the occurrence of a damage when the carrier tape is wound on the reel or the like.

An additional object of the invention is to provide a carrier tape of which the attachment sheet can be smoothly wound when the carrier tape is wound on the reel or the like, so that the retainer arms or the like is prevented from being displaced and the winding of the carrier tape can be improved.

Consequently, the first subject matter of the invention is a carrier tape made of synthetic resin which is provided in a line with a large number of accommodating recesses in which the top surface of said tape is open to contain electronic parts or the like and each of which is provided with retainer arms projected to the inside thereof to prevent the contained electronic part from falling out, characterized in that said retainer arm is formed in a separate attachment sheet secured to the top surface of said tape.

Also, the second subject matter of the invention is a carrier tape made of synthetic resin which is provided in a line with a large number of accommodating recesses in which the top surface of said tape is open to contain electronic parts or the like and each of which is provided with retainer arms projected to the inside thereof to prevent the contained electronic part from falling out, characterized in that said retainer arm is formed in a separate attachment sheet secured to the top surface of said tape and said retainer arm is substantially horizontally projected at the top level of said recess in order to prevent the bottom of the upper accommodating recess from fitting into the inside of the lower accommodating recess when the carrier tape is lapped in layers.

Also, the third subject matter of the invention is a carrier tape made of synthetic resin which is provided in a line with a large number of accommodating recesses in which the top surface of said tape is open to contain electronic parts or the like and each of which is provided with retainer arms projected to the inside thereof to prevent the contained electronic part from falling out, characterized in that said retainer arm is formed in a separate attachment sheet secured to the top surface of said tape and said attachment sheet is provided with slits.

DETAILED DESCRIPTION OF THE PREFERRED EMBODIMENT

An embodiment of the present invention will now be explained with reference to the accompanying drawings.

Figure 1:
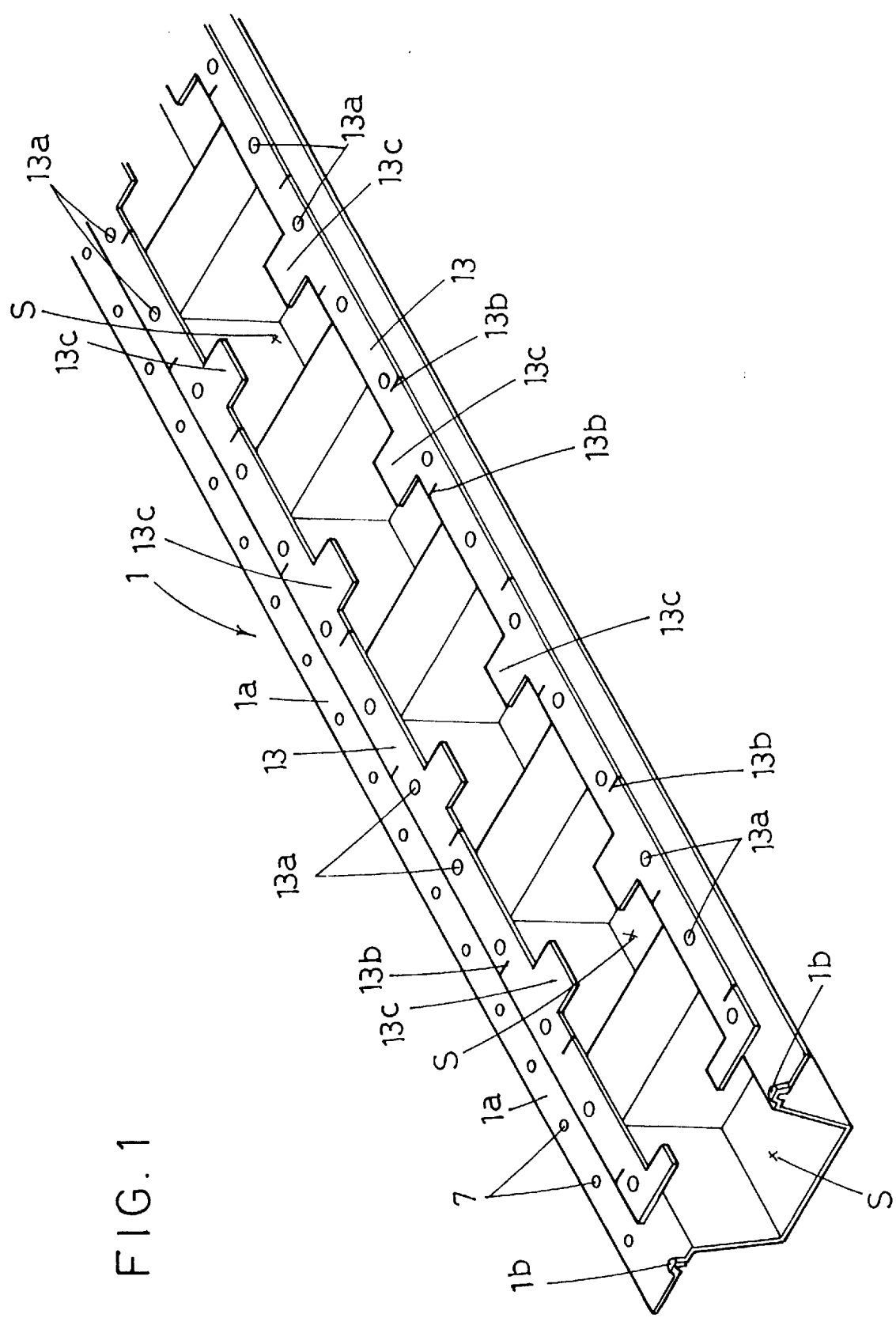
FIG. 1 is an entire perspective view of an embodiment of the carrier tape.
Figure 2:
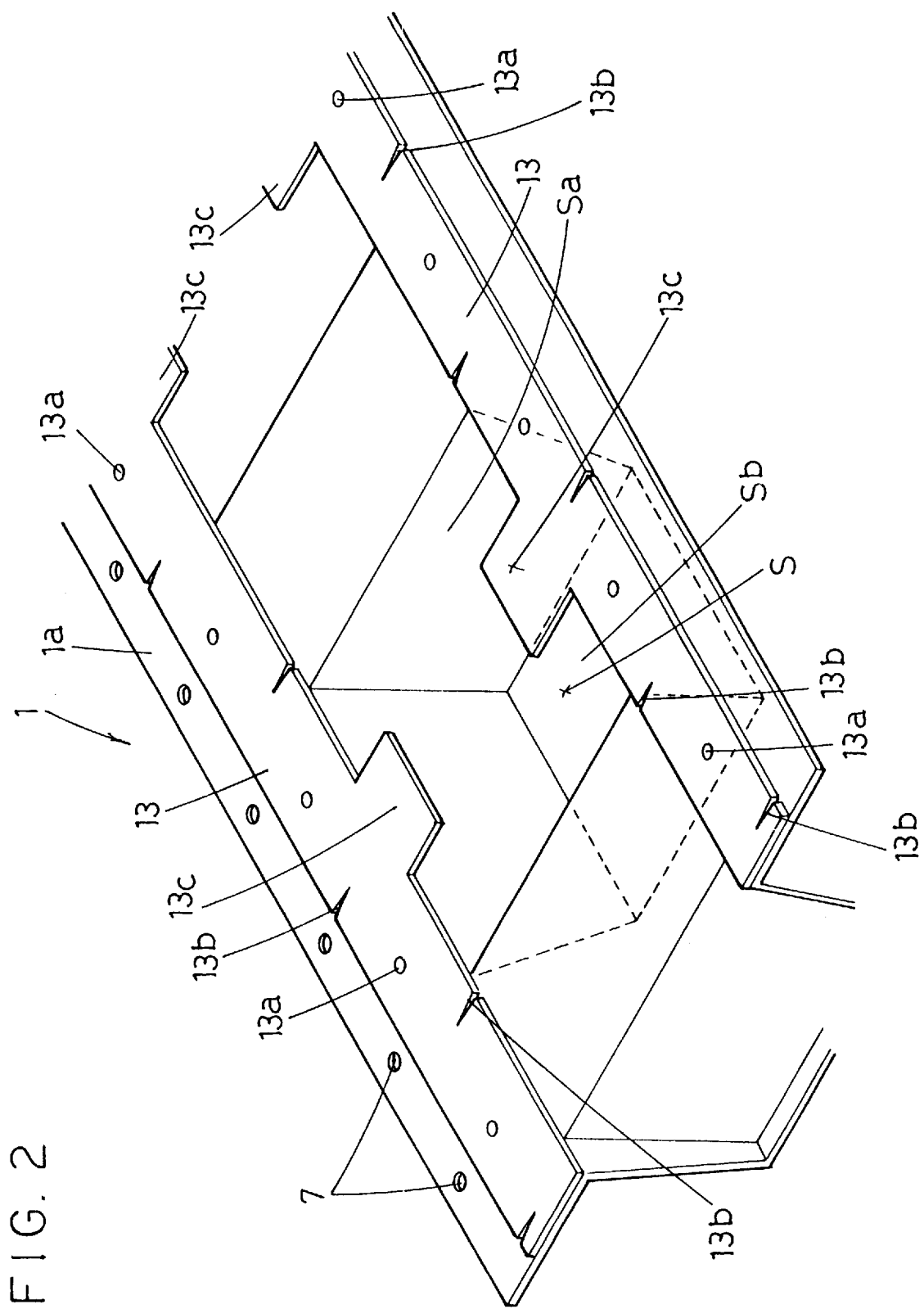
FIG. 2 is an enlarged perspective view of the principal portion in FIG. 1.
Figure 3:
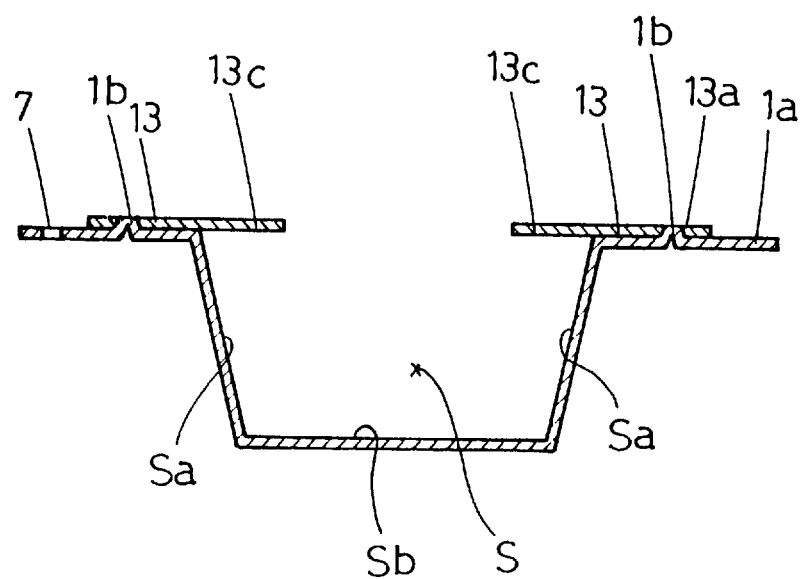
FIG. 3 is a vertical sectional view of FIG. 2.

FIG. 1 is a perspective view of an embodiment of the carrier tape, FIG. 2 is an enlarged view of the principal portion of the tape and FIG. 3 is a sectional view of the accommodating recess.

In FIG. 1 to FIG. 3, longitudinally secured on the top surface 1a of a carrier tape 1 are a pair of attachment sheets 13, 13 made of synthetic resin in a strap form respectively. On the attachment sheet 13 a plurality of retainer arms 13c, 13c, 13c are formed as integral parts of the sheet in a projected condition at predetermined intervals and also longitudinally on the outside of the sheet 13a plurality of snap holes 13a, 13a, 13a are drilled at predetermined intervals. Furthermore, on the outside and inside of the attachment sheet 13 a plurality of slits 13b, 13b, 13b are alternately formed in the longitudinal direction.

On the other hand, the carrier tape 1 is provided a plurality of accommodating recesses S at predetermined intervals in the longitudinal direction. The accommodating recess S is open in the top and embossed in a trapezoid in section with side walls Sa, Sa, Sa, Sa formed in four sides stretched from the bottom Sb toward the top opening. The accommodating recess S has a simple form with side walls Sa, Sa, Sa, Sa and a bottom Sb and has no cutout portion K as in the prior art. Furthermore, in the outside of the accommodating recesses S on the top surface 1a of the carrier tape 1 there are lugs 1b, 1b, 1b formed as integral parts thereof at predetermined intervals in the longitudinal direction. Those lugs 1b are formed at the same time when the accommodating recesses S are embossed. Toward each lug 1b the snap hole 13a of the attachment sheet 13 is pressed and the lug 1b is fitted into the snap hole 13a, so that the attachment sheet 13 is secured to the top surface of the carrier tape 1. Incidentally, the attachment sheet 13 may be stuck on the top surface 1a of the carrier tape 1 by heat seal.

The carrier tape 1 described above is operated as follows. As shown in FIG. 3, when a pair of the attachment sheets 13, 13 are secured to the top surface 1a of the carrier tape 1, a pair of the retainer arms 13c, 13c are projected oppositely and substantially horizontally at the top level of every accommodating recess S. Owing to those retainer arms 13c, 13c, the contained electronic part or the like can be prevented from falling out of the accommodating recess S.

Figure 6:
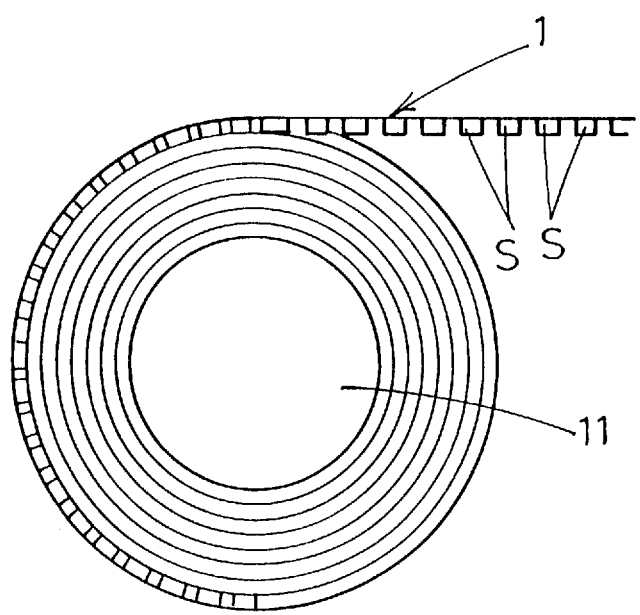
FIG. 6 is a side view of the carrier tape wound in a coil on a reel.
Figure 7:
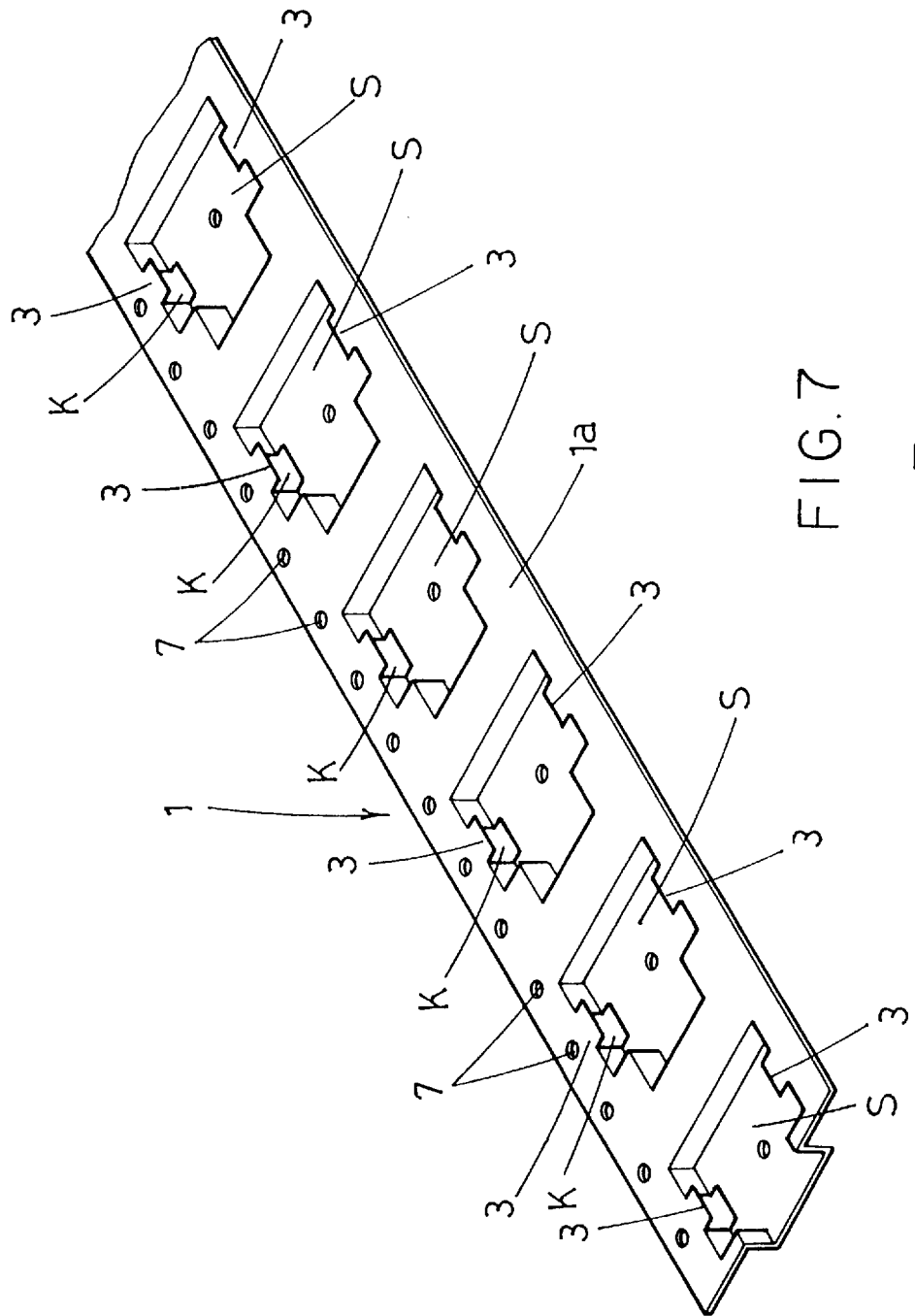
FIG. 7 is an entire perspective view of a carrier tape in the prior art.
Figure 8:
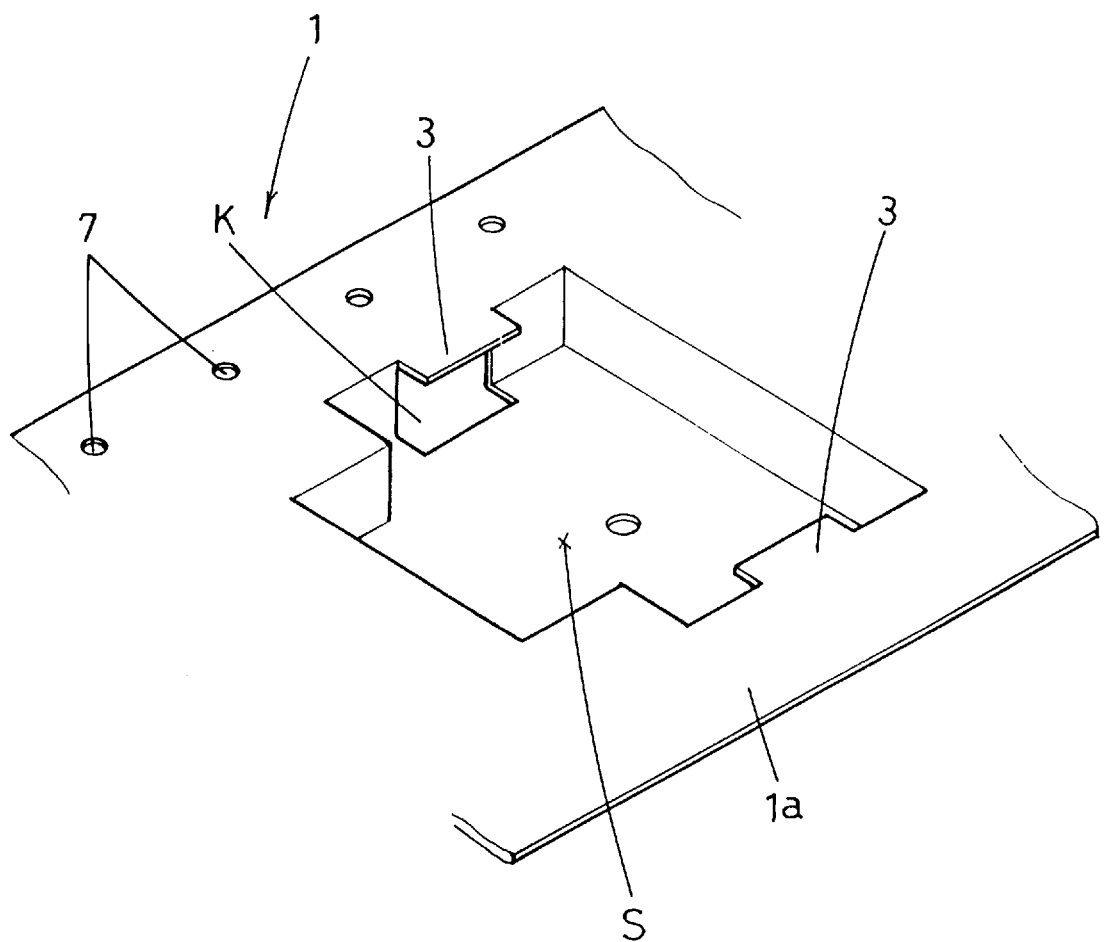
FIG. 8 is an enlarged perspective view of the principal portion in FIG. 7.

As shown in FIG. 6, such a carrier tape 1 is used to be wound on the reel 11 and the attachment sheet 13 is smoothly wound in a coil on the reel 11 when the carrier tape 1 is stored by winding, because the attachment sheet 13 is provided with slits 13b, 13b, 13b formed at predetermined intervals. As a result, the retainer arm 13c is effectively prevented from displacing and the snap hole 13a from coming out of the lug 1b.

Furthermore, in the present invention, the attachment sheet 13 is formed as a separate part and provided with the retainer arms 13c as integral parts thereof, and thereafter secured to the top surface 1a of the carrier tape 1. (1) Consequently, the accommodating recess S of the carrier tape 1 can be made in a simple form. As a result, the carrier tape 1 can be easily formed with a simple forming die which is made in a low cost. Besides, since the attachment sheet 13 can be easily made in a strap form, the total cost of the carrier tape 1 can be remarkably decreased. (2) In addition, since no cutout portion K is formed in the accommodating recess S, the content does not fall out of the recess S even when the content is a fine electronic part, and the dust or the like hardly enters the recess S. (3) Since the attachment sheet 13 is made as a separate part to the carrier tape 1, the thickness of the sheet 13 can be determined at will. Consequently, the thickness of the retainer arm 13c can be also determined to ensure the strength of itself independent of the thickness of the carrier tape 1. (4) On the contrary, it is possible to make the accommodating recess S in a deep form by increasing the thickness of the carrier tape 1. Thereby, it is possible to solve such a fault that when the accommodating recess S in the prior are was made in a deep form, the side walls Sa were remarkably decreased.

In the attachment sheets 13, 13 secured to the top surface 1a of the carrier tape 1, when the space between the retainer arms 13c, 13c oppositely disposed on the top surface 1a is selected to be narrower than the width of the bottom Sb of the accommodating recess S, the contained electronic part or the like can be surely prevented from falling out of the accommodating recess S even if the carrier tape 1 is used in a condition turned upside down.

When the carrier tape 1 is wound on the reel 11, the mutual accommodating recesses S are in a vertical-layered condition. In this case, even if the upper and lower accommodating recesses S are layered in accord with each other, the upper recess is supported on the retainer arms 13c, 13c because of the substantially horizontal projection of those retainer arms 13c, 13c on the top surface 1a of the carrier tape 1 in this embodiment. That is, those retainer arms 13c, 13c can effectively prevent the upper accommodating recess S from fitting in the lower recess S.

Although, in this embodiment, a pair of the attachment sheets 13, 13 are secured to the top surface 1a of the carrier tape 1 in both the sides of every accommodating recess S, a single attachment sheet 13 may be secured to the central portion of the carrier tape 1 in the longitudinal direction. In this case, the attachment sheet 13 may be provided with openings over the respective accommodating recesses S and retainer arms 13c, 13c may be formed so as to project substantially horizontally on the top level of and to the inside of the recess S.

Also in this embodiment, when the electronic part is pinched by clamping claws (not shown) to be inserted into the accommodating recess S, the accommodation of the electronic part can be performed by smoothly bending of the retainer arms 13c and on the contrary, when the part is unloaded, this unloading is easily performed also by smoothly bending of the retainer arms 13c.

Figure 4:
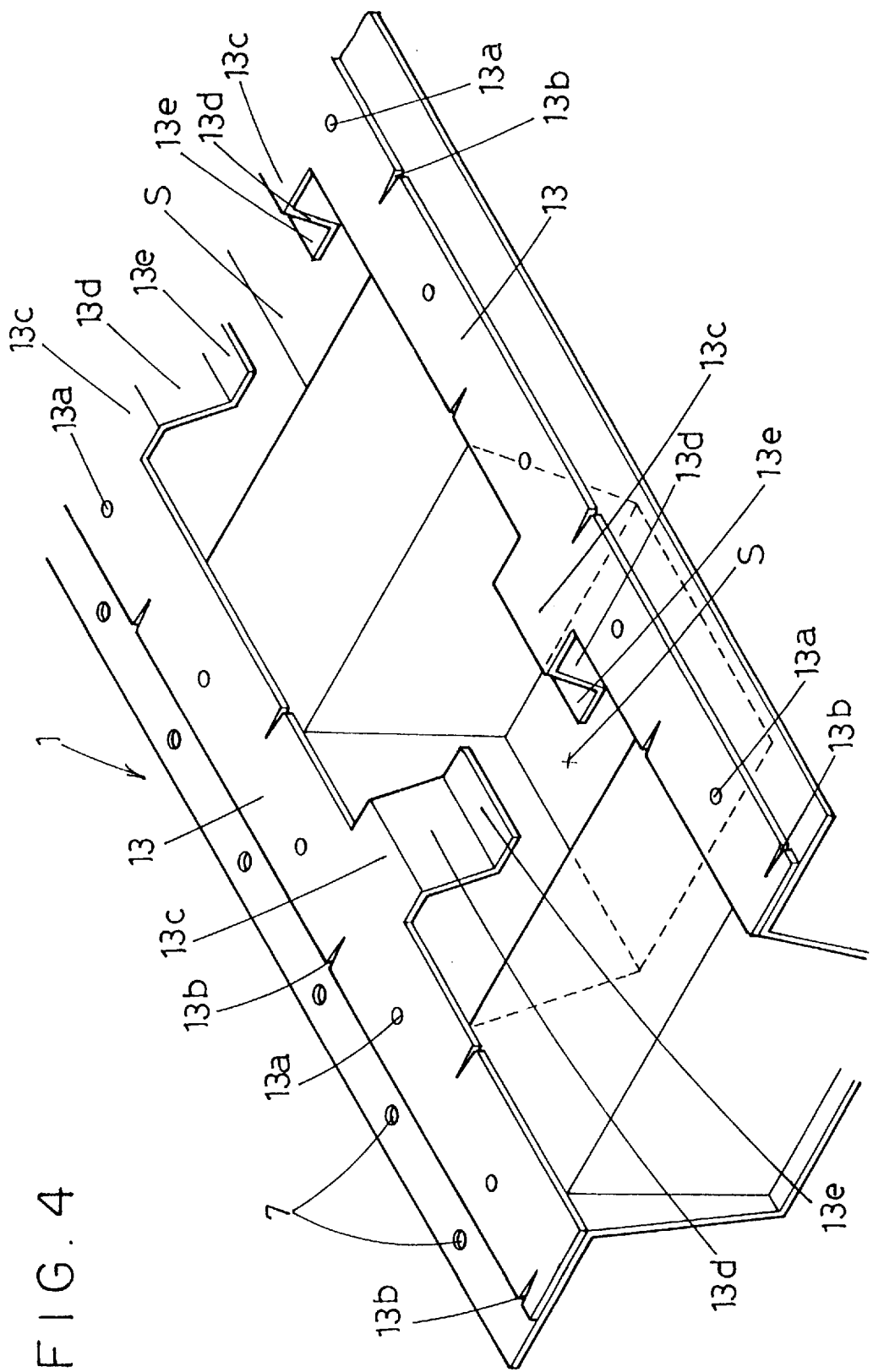
FIG. 4 is a perspective view of the principal portion of the carrier tape of which the retainer arm is changed in the shape.
Figure 5:
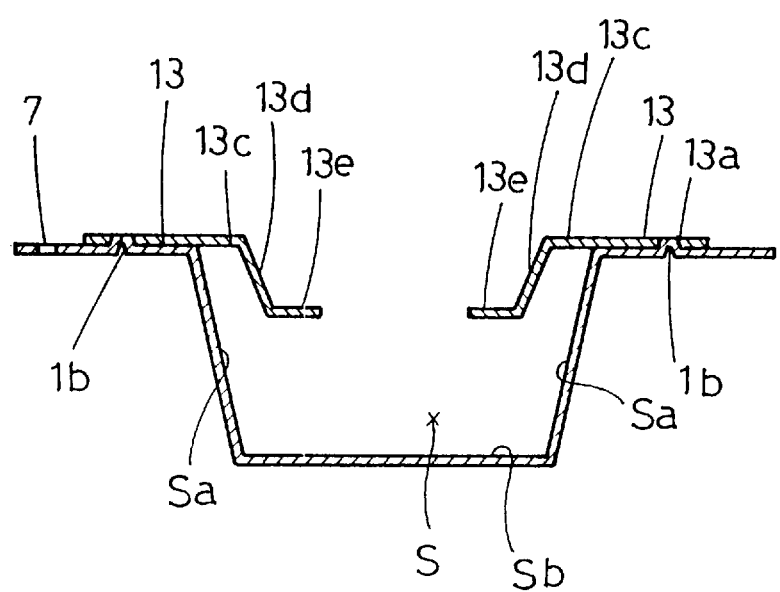
FIG. 5 is a vertical sectional view of FIG. 4.

Next, a further embodiment of the carrier tape is shown in an enlarged view of the principal portion of FIG. 4 and a sectional view of FIG. 5. In this embodiment, the attachment sheet 13 is provided with projecting retainer arms 13c having slant portion 13d respectively formed as an integral part at the front end thereof and moreover having a horizontal projection 13e at the lower end of the slant portion 13d formed also as an integral part. The residual constitution is the same as shown in FIG. 1 to FIG. 3.

Also in this embodiment, the retainer arms 13c, slant portions 13d and projections 13e can effectively prevent the contained electronic part or the like from falling out of the accommodating recess S. In addition, a pair of the projections 13e, 13e, which is brought into contact with the sides of the electronic part, can firmly hold the electronic part in the accommodating recess S to prevent the part from rattling in the accommodating recess S.

Also in this embodiment, when the electronic part is pinched by clamping claws (not shown) to be inserted into the accommodating recess S, the accommodation of the electronic part can be performed by smoothly bending of the retainer arms 13c, slant portions 13d and projections 13e and on the contrary, when the part is unloaded, this unloading is easily performed also by smoothly bending of the retainer arms 13*c*, slant portions 13*d* and projections 13*e*.

Furthermore, since the attachment sheet 13 in this embodiment is also made as a separate part to the carrier tape 1, the thickness of the sheet 13 can be determined at will. Consequently, the thickness of the retainer arm 13*c*, slant portion 13*d* and projection 13*e* can be also determined to ensure the strength of themselves independent of the thickness of the carrier tape 1.

Furthermore, also when the the carrier tape 1 is wound on the reel 11 and the mutual accommodating recesses S are in a vertical-layered condition, the bottom Sb of the upper accommodating recess S is supported on the retainer arms 13*c*, 13*c*. That is, those retainer arms 13*c*, 13*c* can effectively prevent the upper accommodating recess S from fitting in the lower recess S and can surely prevent the damage of the carrier tape 1 due to the mutual engaging of the accommodating recesses.

What is claimed is:

1. A carrier tape made of synthetic resin which is provided in a line with a large number of accommodating recesses in which the top surface of said tape is open to contain electronic parts and each of which is provided with retainer arms projected to the inside thereof to prevent the contained electronic part from falling out, characterized in that said retainer arm is formed in a separate attachment sheet secured to the top surface of said tape and said retainer arm is substantially horizontally projected at the top level of said recess in order to prevent the bottom of the upper accommodating recess from fitting into the inside of the lower accommodating recess when the carrier tape is lapped in layers.

2. A carrier tape made of synthetic resin which is provided in a line with a large number of accommodating recesses in which the top surface of said tape is open to contain electronic parts and each of which is provided with retainer arms projected to the inside thereof to prevent the contained electronic part from falling out, characterized in that said retainer arm is formed in a separate attachment sheet secured to the top surface of said tape and said attachment sheet is provided with slits.

* * * * *